(12) United States Patent
Kwak

(10) Patent No.: US 7,289,385 B2
(45) Date of Patent: Oct. 30, 2007

(54) BANK SELECTION SIGNAL CONTROL CIRCUIT FOR USE IN SEMICONDUCTOR MEMORY DEVICE, AND BANK SELECTION CONTROL METHOD

(75) Inventor: Jin-Seok Kwak, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 164 days.

(21) Appl. No.: 11/270,899

(22) Filed: Nov. 12, 2005

(65) Prior Publication Data

US 2006/0262631 A1 Nov. 23, 2006

(30) Foreign Application Priority Data

Nov. 12, 2004 (KR) .................. 10-2004-0092338

(51) Int. Cl.
*G11C 8/00* (2006.01)
(52) U.S. Cl. .................. 365/230.03; 365/233
(58) Field of Classification Search .......... 365/230.03, 365/233, 230.02, 195, 196, 194, 189.02; 711/157
See application file for complete search history.

(56) References Cited

U.S. PATENT DOCUMENTS 7,180,807 B2 * 2/2007 Park ...................... 365/222

2002/0105635 A1 * 8/2002 Koshikawa ............... 356/233
2003/0067834 A1 * 4/2003 Lai .......................... 365/233

* cited by examiner

Primary Examiner—Richard T. Elms
Assistant Examiner—Douglas King
(74) Attorney, Agent, or Firm—F. Chau & Associates, LLC

(57) ABSTRACT

Memory bank selection control circuits and methods are provided which improve the data sensing margin for data sense amplifiers in a multi-bank semiconductor memory structure. In one aspect, a bank selection signal control circuit includes a bank switch control unit that receives memory bank selection signals and outputs corresponding memory bank selection control signals to selectively connect memory banks to a global data input/output line according to a predetermined sequence. For memory bank selected prior to a last selected memory bank in the predetermined sequence, the bank switch control unit outputs memory bank selection control signals that are enabled for a first time period P1, and for the last selected memory bank, the bank switch control unit outputs a memory bank selection control signal that is enabled for a second time period P2, wherein P2 is greater than P1. A switching unit sequentially connects each selected memory bank to the global data input/output line according to the predetermined sequence, and for a predetermined period P1 or P2, in response to the corresponding bank selection control signals.

20 Claims, 6 Drawing Sheets

BANK SELECTION SIGNAL CONTROL CIRCUIT FOR USE IN SEMICONDUCTOR MEMORY DEVICE, AND BANK SELECTION CONTROL METHOD

CROSS-REFERENCE TO RELATED APPLICATION

This application claims priority to Korean Patent Application No. 2004-92338, filed Nov. 12, 2004, which is incorporated herein by reference in its entirety.

TECHNICAL FIELD OF THE INVENTION

The present invention relates generally to bank selection control circuits and methods for use with semiconductor memory devices having multi-bank frameworks. More specifically, the present invention relates to bank selection control circuits and methods that provide improved sensing margin for data sense amplifiers in a multi-bank memory structure.

BACKGROUND

Memory devices have typically been developed with emphasis on high integration and large capacity frameworks, while central processing units (CPUs) have typically been developed with emphasis on high speed operation, which has led to large disparities between the operating speeds of memory and CPU systems. In this regard, despite the implementation of high-speed CPUs, the overall performance of computer systems have been limited, primarily in part, by the lower operating speeds of memory devices. Accordingly, memory systems are now being developed with more emphasis on high speed and high-performance operation, to provide increased data input/output per unit time. In general, high performance memory systems are realized by implementation of high speed memory devices together with data I/O interfaces that enable high speed data transfer between the memory devices and other system components.

FIG. 1 schematically illustrates a conventional framework of a semiconductor memory system. In particular, FIG. 1 depicts a conventional framework of a DRAM (Dynamic Random Access Memory) with a shared data I/O network. Referring to FIG. 1, the memory system generally comprises a plurality of memory banks 10A, 10B, 10C, 10D, where each memory bank has an independent data input/output network connected to a global data input/output network shared among the memory banks, as explained hereafter, Each bank 10A~10D includes a memory array comprising a plurality of wordlines, WL0, WL1 . . . (or generally, WL) extending in a row direction and a plurality of bit line pairs BL/BLB extending in a column direction, and a plurality of memory cells MC arranged in a matrix in a region where the wordlines WL intersect the bit line pairs BL/BLB. Each bit line pair BL/BLB is connected to a bit line sense amplifier 13.

When a word line WL is enabled by an active command of a row address strobe signal /RAS, the data stored in each memory cell MC in the row of memory cells connected to the word line WL is transmitted to corresponding bit lines BL and BLB. Data of memory cells connected to an enabled word line WL are charge-shared to bit lines BL, slightly increasing or decreasing a voltage level of bit lines BL and BLB. The bit lines BLB of memory cells individually adjacent to the bit lines BL are "complementary bit lines", which maintain a voltage level precharged to a reset bit line voltage. The variation in the voltages loading on a given bit line pair BL/BLB is sensed and amplified by the sense amplifier 13 connected to the given bit line pair BL/BLB to thereby read the data of a memory cell connected to the activated WL.

The output of the bit line sense amplifier 13, bit lines BL and BLB, are selected by a column selection circuit that is activated by an active command of a column address strobe signal /CAS. The data of bit line BL and complementary bit line BLB sensed by the bit line sense amplifier 13 is coupled to a local data input/output line pair LIO/LIOB in response to a column selection signal CSL. The local data input/output line pair LIO/LIOB of a given memory bank 10A~10D is selectively connected to a global data input/output line pair GIO/GIOB by operation of corresponding selection blocks 15A~15D (or generally, 15i), which part of a switching circuit. The switching circuit may be configured as a multiplexer (MUX). In essence, the local data input/output line pairs LIO/LIOB of the memory banks 10A-10D are individually connected to, and share, the global data input/output line pair GIO/GIOB, and the global data input/output line pair GIO/GIOB is shared by the plurality of memory banks 10A~10D.

The global data input/output line pair GIO/GIOB is connected to a data sense amplifier 17. The switching circuit determines which memory bank 10A~10D will be connected to the data sense amplifier block 17. The data transferred to the data sense amplifier 17 through the global data input/output line pair GIO/GIOB is sensed and amplified by the data sense amplifier 17, and then output through an output buffer.

FIG. 2 schematically illustrates is a circuit diagram of a selection block 15i of FIG. 1. The selection block 15i includes a load block 19, a switching block 20 and a bank switch control block 16. The load block 19 includes two load transistors P10 and P11 having drain/source terminals connected between a power source voltage terminal VDD and respective local input/output data lines LIO/LIOB, and gate terminals that are grounded.

The switching block 20 includes P-type transistors P12 and P13 that operate as switches under control of the bank switch control block 16. The transistor P12 selectively connects the local data line LI0 to the global data line GIO, and the transistor P13 selectively connects the local data line LI0B to the global data line GI0B. The switching operation is controlled by a bank selection control signal PWRD_i applied from the bank switch control block 16. The bank switch control block 16 is a delay circuit that receives as input bank selection signal CAB_i which is generated in response to a memory bank address signal, and then outputs the bank selection control signal PWRD_i.

Current applied through the load block 19 by using the switching block 20 flows to each of the global data input/output line pair GIO/GIOB through the local data input/output line pair LIO/LIOB. The current volume flowing through the global data input/output line GIO and the complementary global data input/output line GIOB is different based on the data value transmitted to the local data input/output line pair LIO/LIOB.

FIG. 3 is a circuit diagram illustrating a data sense amplifier 17 of FIG. 1. In general, the data sense amplifier 17 includes a current sense amplifier 23 and a voltage sense amplifier 25. The current sense amplifier 23 is a type of data line sense amplifier that is used when data is transmitted through current. When the current sense amplifier 23 shares multiple memory banks, the length of the data line is increased and thus, transmission of data using a current signal improves the transmission speed of data through the data line. The current sense amplifier 23 senses and amplifies the current of the global data input/output line pair GIO/GIOB, and determines a voltage level of internal data input/output line pair IDIO, IDIOB.

The current sense amplifier 23 is operable in a semiconductor memory device having low power source voltage. The current sense amplifier 23 includes sensing transistors P14 and P16, a voltage device 21 including N-channel transistors N12 and N14 (which change an input current to a voltage), and a switching transistor N10. The sensing transistors P14 and P16 are formed to have matching electrical characteristics. The source terminals of transistors P14 and P16 are respectively connected to the global data input/output lines GIO and GIOB. The gate and drain terminals of transistors P14 and P16 are cross connected. The drain terminals of transistors P14 and P16 are connected to internal data input/output line pair IDIO/IDIOB to transfer an output of the current sense amplifier 23 as an input voltage to a latch-type sense amplifier 25 provided as a type of voltage sense amplifier.

The N-channel transistors N12 and N14 of the voltage device 21 are formed to have matching electrical characteristics. The transistors N12 and N14 are individually connected between the internal data input/output line pair IDIO/IDIOB and the switching transistor N10, and have gate terminals that are connected to a power source voltage. In the voltage device 21, the internal data input/output line IDIO and the complementary internal data input/output line IDIOB have mutually different voltage levels, and these voltage levels are transferred to the voltage sense amplifier 25 and are then latched therein. The voltage sense amplifier 25 has a standard configuration well-known by those skilled in the art. The voltage sense amplifier 25 is enabled by a data sense amplifier enable signal DSAEN, and latches a voltage level transferred from the current sense amplifier 23.

The switching transistor N10 is selectively activated in response to a sensing enable signal PIOSE. When activated, the switching transistor N10 provides a current path through which current of a given volume supplied by the load block (19 of FIG. 2) flows to ground.

FIG. 4 is a timing diagram that illustrates a bank interleave operation of the memory system of FIG. 1. Referring to FIG. 4, in the multi-bank semiconductor memory device of FIG. 1, it is assumed that an external clock signal ECLK is inputted, and a read signal ARD of the first bank 10A, a read signal BRD of the second bank 10B, a read signal CRD of the third bank 10C, and a read signal DRD of the fourth bank 10D are sequentially applied as a command signal COMMAND. Column selection signals CSL_a, CSL_b, CSL_c and CSL_d of respective banks are sequentially applied following the respective memory bank read signals ARD, BRD, CRD and DRD.

Further, respective bank selection control signals PWRD_i for the memory banks 10A~10D are enabled before respective column selection signals CSL are enabled, to thereby connect respective memory banks 10A, 10B, 10C, 10D to the global data line pair GIO,GIOB. In particular, as depicted in FIG. 4, the bank selection control signals PWRD_a~PWRD_d are sequentially enabled (logic low) and disabled (logic high) such that the enabled periods of such signals are non-overlapping. The column select signals CSL_a~CLS_d are enabled (logic high) and disabled within the enabled periods of respective bank selection control signals PWRD_a~PWRD_d.

The local data input/output line pair LIO, LIOB and the global data input/output line pair GIO, GIOB are connected when the bank selection control signals PWRD_a, PWRD_b, PWRD_c, PWRD_d are enabled, and the current sense amplifier 23 (FIG. 3) operates to apply a voltage level corresponding to data to an internal data input/output line pair IDIO, IDIOB. With a voltage level corresponding to data of the internal data input/output line pair IDIO, IDIOB, data is sensed by enabling the data sense amplifier by an enable signal DSAEN in the voltage sense amplifier 25 (FIG. 3).

In the conventional multi-bank semiconductor memory device described above, current signals sequentially input by read data values are inputted to the data sense amplifier 17 after a bank selection control signal PWRD_i is enabled, and then a determined time lapses. In this case, when sensing the data of the selected memory banks, the margin for sensing data of the last memory bank is smaller by an amount indicated by the circled region 27 in FIG. 4. In particular, a given period of time is required to form a current path by a signal of memory bank when a bank selection control signal PWRD_i is enabled and to reach the current sense amplifier 23 of the data sense amplifier 17. Consequently, when there is no enabled bank selection control signal PWRD_i, a global data input/output line pair GIO/GIOB is not connected to any memory bank. In such instance, no current path is formed and the voltage device 21 (FIG. 3) rapidly discharges an internal voltage. As depicted in FIG. 4, the global data lines GIO/GIOB are continuously loaded with current due to the sequential, and continuous application of the first three bank selection control signals PWRD_a, PWRD_b and PWRD_c. But when the last signal PWRD_d is disabled, there is no continuous current path for the data signal of the last selected bank (e.g., bank 10D) and thus, the input data valid window for sensing the data of the last memory bank is relatively smaller than the input data valid window for sensing data signals of the previously, continuously selected banks, thereby resulting in an operating frequency limit in a data sensing.

SUMMARY OF THE INVENTION

Exemplary embodiments of the invention include bank selection control circuits and methods for use in multi-bank memory devices, which provide improved sensing margin for data sense amplifiers in a multi-bank memory structure. Exemplary bank selection control circuits and methods are designed to prevent or mitigate limitations in the operating frequency in data sensing by providing data sensing through a large valid window of input data and ensuring a sensing margin in a data sense amplifier.

In one exemplary embodiment of the invention, a bank selection signal control circuit is provided for use in a semiconductor memory device. The circuit includes a bank switch control unit that receives memory bank selection signals and outputs corresponding memory bank selection control signals to selectively connect memory banks to a global data input/output line according to a predetermined sequence. For each selected memory bank in the predetermined sequence which is selected prior to a last selected memory bank, the bank switch control unit outputs memory bank selection control signals that are enabled for a first time period P1. In addition, for the last selected memory bank in the predetermined sequence, the bank switch control unit outputs a memory bank selection control signal that is enabled for a second time period P2, wherein P2 is greater than P1. The circuit further includes a switching unit that sequentially connects each selected memory bank to the global data input/output line according to the predetermined sequence, and for a predetermined period P1 or P2, in response to the corresponding bank selection control signals. The switching unit may include transistors that are respectively connected between the memory bank and the global data input/output line.

The global data input/output line may be connected to a data sense amplifier block for sensing and amplifying data transmitted through a local data bus of the selected memory bank. The data sense amplifier block may include a current sense amplifier for sensing, amplifying and outputting data transmitted through the global data input/output line, and a voltage sense amplifier for sensing, amplifying and outputting an output of the current sense amplifier.

In another exemplary embodiment of the invention, the bank switch control unit comprises a plurality of unit control blocks, wherein each unit control block generates a memory bank selection control signal for a corresponding memory block. In one exemplary embodiment, each unit control block includes a delay circuit for receiving the memory bank selection signal for the corresponding memory bank and delaying the bank selection signal for a predetermined period to generate a delayed bank selection signal, a first logic circuit for receiving and logically combining the memory bank selection signals corresponding to other memory banks not including the memory bank selection signal applied to the delay circuit, and a second logic circuit for receiving and logically combining output signals of the delay circuit and the first logic circuit to generate the bank selection control signal for the corresponding memory bank. In one exemplary embodiment, the first logic circuits are NOR circuits, and the second logic circuits are NAND circuits.

According to another exemplary embodiment of the invention, a semiconductor memory device includes a plurality of memory banks, a global data input/output line shared by the plurality of memory banks and a data sense amplifier connected to the global data input/output line. In addition, the semiconductor device includes a multiplexer for selectively connecting the memory banks to the global data input/output line in response to bank selection control signals, and a bank selection signal control circuit for generating the bank selection control signals to control the multiplexer. At least one bank selection control signal for selectively connecting one of the memory banks with the global data input/output line is enabled for a time period P2 which is greater than a time period P1 for which all other bank selection control signals are enabled. In one exemplary embodiment of the invention, the semiconductor memory device can perform a bank interleave operation, wherein the at least one bank selection control signal enabled for a time period of P2 is generated for a last selected memory bank of a predetermined sequence of selected memory banks in the bank interleave operation.

In another exemplary embodiment of the invention, the bank selection signal control circuit includes a bank switch control unit that receives memory bank selection signals and outputs corresponding memory bank selection control signals to selectively connect the memory banks to the global data input/output line according to the predetermined sequence, and a multiplexer for sequentially connecting each selected memory bank to the global data input/output line according to the predetermined sequence, and for a predetermined period P1 or P2, in response to the corresponding bank selection control signals.

In another exemplary embodiment, the bank switch control unit includes a plurality of unit control blocks, wherein each unit control block generates a memory bank selection control signal for a corresponding memory block. In one exemplary embodiment, each unit control block includes a delay circuit for receiving the memory bank selection signal for the corresponding memory bank and delaying the bank selection signal for a predetermined period to generate a delayed bank selection signal; a first logic circuit for receiving and logically combining the memory bank selection signals corresponding to other memory banks not including the memory bank selection signal applied to the delay circuit and a second logic circuit for receiving and logically combining output signals of the delay circuit and the first logic circuit to generate the bank selection control signal for the corresponding memory bank.

In yet another exemplary embodiment of the invention, a method is provided for performing a bank interleaving operation in a semiconductor memory device having a plurality of memory banks. The method includes receiving a sequence of bank selection signals for selecting a plurality of memory banks and outputting a sequence of bank selection control signals in response to the sequence of bank selection signals to selectively connect the memory banks to a global data input/output line according to a predetermined sequence, wherein at least one of the bank selection control signals is enabled for a time period P2 which is greater than a time period P1 for which all other bank selection control signals are enabled. In one exemplary embodiment, the at least one bank selection control signal enabled for the time period of P2 is output in response to the bank selection signal for a last selected memory bank in the predetermined sequence for the bank interleave operation.

In another exemplary embodiment, the step of outputting the sequence of bank selection control signals in response to the sequence of bank selection signals includes delaying a selected one of the bank selection signals among the plurality of bank selection signals to generate a delayed bank selection signal, logically combining one or more non-selected bank selection signals through a first logic circuit, and logically combining the delayed bank selection signal and an output signal of the first logic circuit through a second logic circuit, to generate a bank selection control signal corresponding to the selected bank selection signal.

These and other exemplary embodiments, features, aspects, and advantages of the present invention will be described and become more apparent from the following detailed description of exemplary embodiments when read in conjunction with accompanying drawings.

DETAILED DESCRIPTION OF EXEMPLARY EMBODIMENTS

Figure 5:
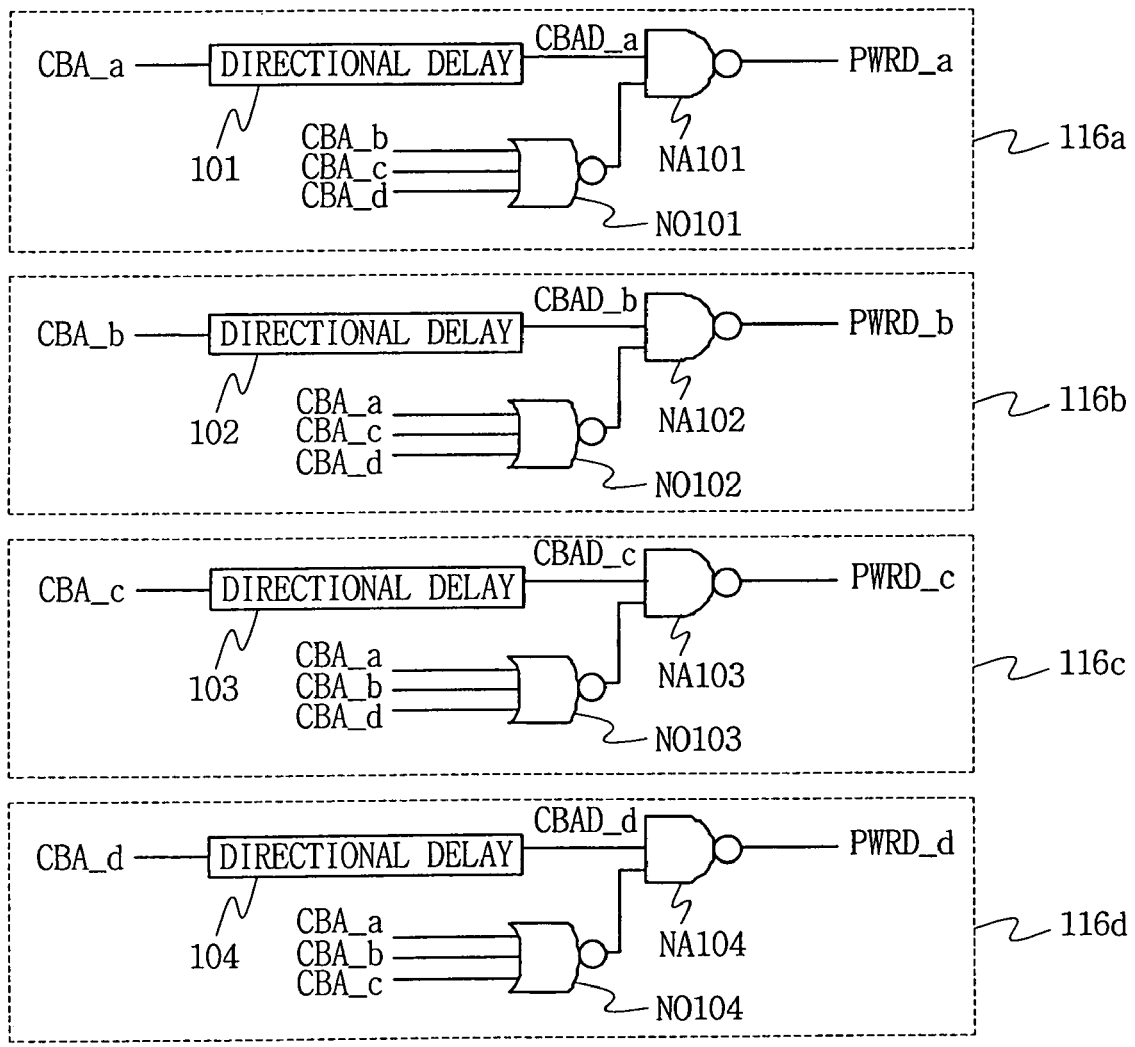
FIG. 5 is a circuit diagram of bank switch control block according to an exemplary embodiment of the invention, which can be implemented in the memory system of FIG. 1.

Exemplary embodiments of the invention described hereafter include bank selection control circuits and methods for use in multi-bank memory devices to provide improved sensing margin for data sense amplifiers. For example, FIG. 5 is a circuit diagram illustrating a bank switch control unit 116 according to an exemplary embodiment of the invention, which can be implemented in a multi-bank memory system having a framework similar to that of FIG. 1. For illustrative purposes, the exemplary bank switch control unit 116 will be discussed with reference to the memory system of FIG. 1, wherein it is assumed that the bank switch control unit 116 is implemented in lieu of the conventional bank switch control block 16 of FIG. 2 and wherein the bank switch control unit 116 and the switching block 20 (FIG. 2) form a bank selection signal control circuit according to an exemplary embodiment of the invention. It is to be understood, however, that the exemplary bank switch control unit 116 depicted in FIG. 5 can be implemented in various semiconductor memory systems having multi-bank memory device frameworks to perform bank interleave operations. Indeed, one of ordinary skill in the art will readily appreciate that bank switch control units having frameworks similar to, or the same as, that of FIG. 5 can implemented in semiconductor memory systems having multi-bank frameworks in which one or more banks share a global data input/output line and/or share a data sense amplifier, etc.

Referring now to FIG. 5, the exemplary bank switch control unit 116 comprises a plurality of unit control blocks 116a, 116b, 116c, 116d, which generate respective bank selection control signals PWRD_a, PWRD_b, PWRD_c and PWRD_d. In the exemplary embodiment, it is assumed that there are four memory banks, but there may be any number of memory banks implemented in a multi-bank memory device, wherein there is one unit control block for each memory bank in the multi-bank memory device. As explained in further detail below, the bank switch control unit 116 controls the applied bank selection control signals PWRD_i such that an enable period of at least one bank selection control signal PWRD_i is longer than the enable periods of other bank selection signals.

As shown in FIG. 5, the unit control blocks 116a~116d comprise delay circuits 101, 102, 103, and 104, respectively. The delay circuits 101, 102, 103, 104 receive as input respective memory bank selection signals CBA_a, CBA_b, CBA_c and CBA_d and delay such signals for a predetermined amount of time to generate respective delayed signals CBAD_a, CBAD_b, CBAD_c and CBAD_d. The delay circuits 101~104 may be implemented as directional delay circuits. In addition, the unit control blocks 116a~116d include respective NOR logic circuits NO101, NO102, NO103, NO104, which receive as input, and logically combine, the memory bank selection signals of other banks which are applied to the corresponding delay circuits 101, 102, 103, 104. For instance, as shown in FIG. 5, the delay circuit 101 of the unit control block 116a receives as input the memory bank selection signal CBA_a, while the NOR gate NO101 receives as input the other memory bank selection signals CBA_b, CBA_c and CBA_d input to the delay circuits 102, 103, 104 of respective unit control blocks 116b, 116c, 116d.

Further, the unit control blocks 116a~116d include respective NAND logic circuits NA101, NA102, NA103, NA104 which receive as input, and logically combine, the outputs of corresponding delay circuits 101~104 and NOR circuits NO101~NO104, to generate and output respective bank selection control signals PWRD_a~PWRD_d. The bank selection control signals PWRD_a, PWRD_b, PWRD_c, PWRD_d control the operation of the switching blocks 20 (FIG. 2) of respective selection blocks 15A~15D (FIG. 1).

Figure 1:
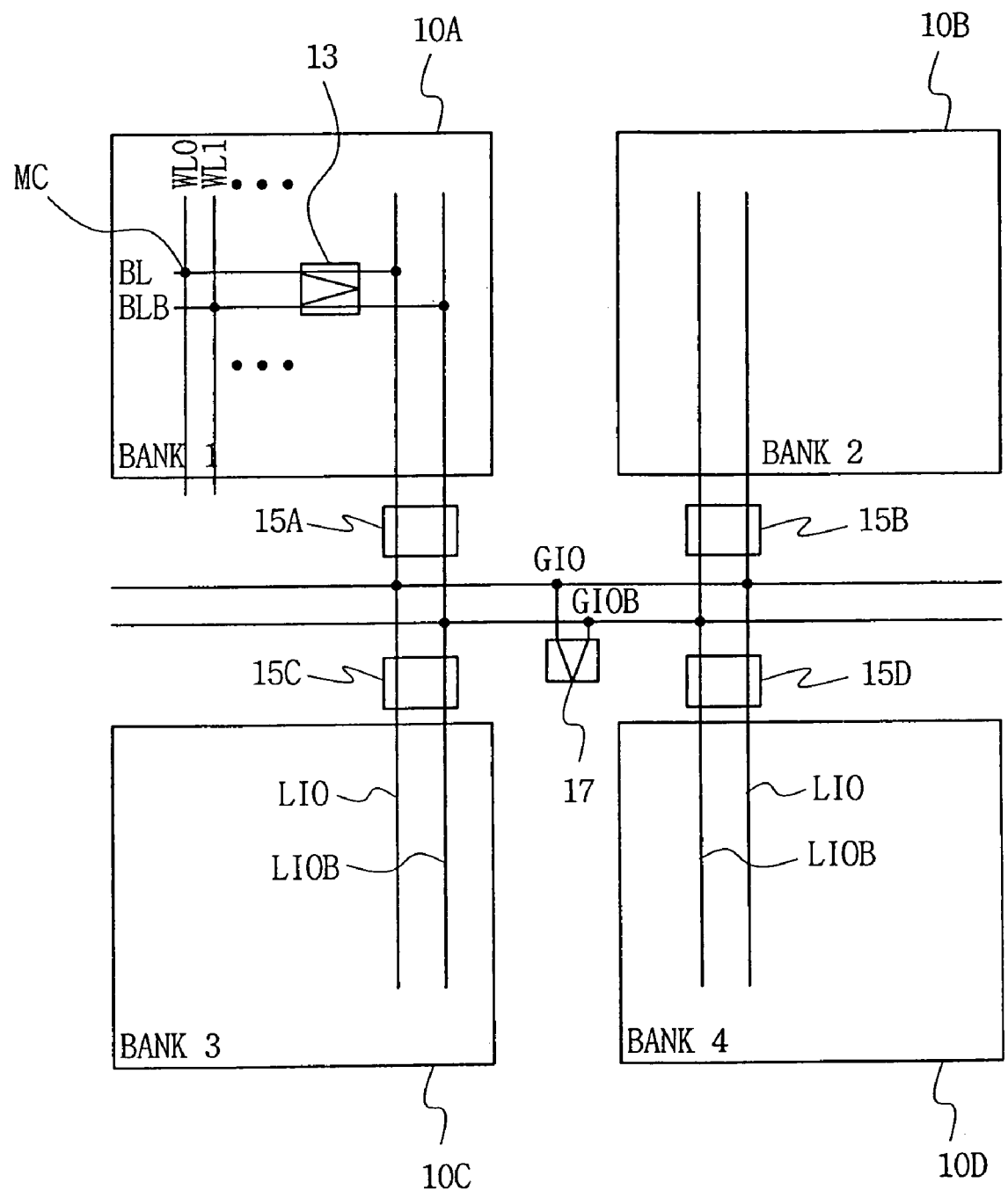
FIG. 1 schematically illustrates a conventional framework of a semiconductor memory system.
Figure 2:
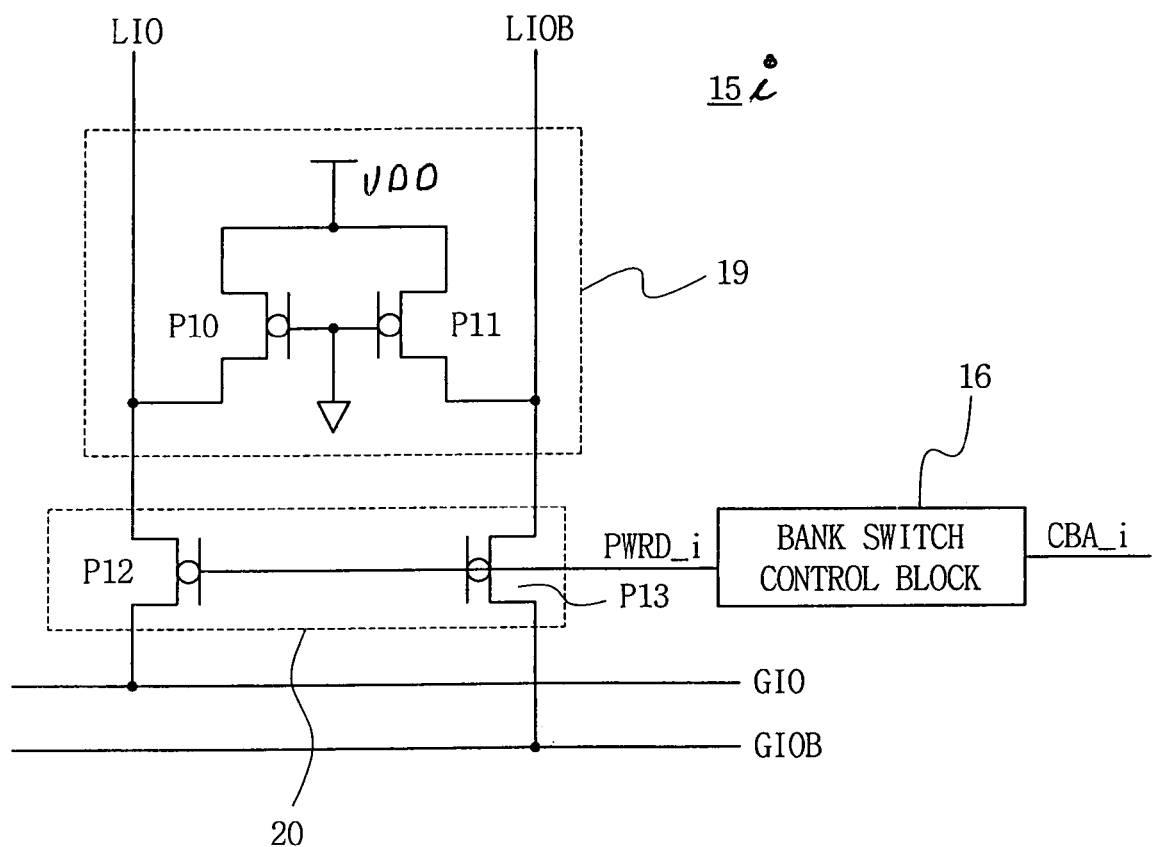
FIG. 2 is a circuit diagram illustrating a selection block of the memory system of FIG. 1.
Figure 3:
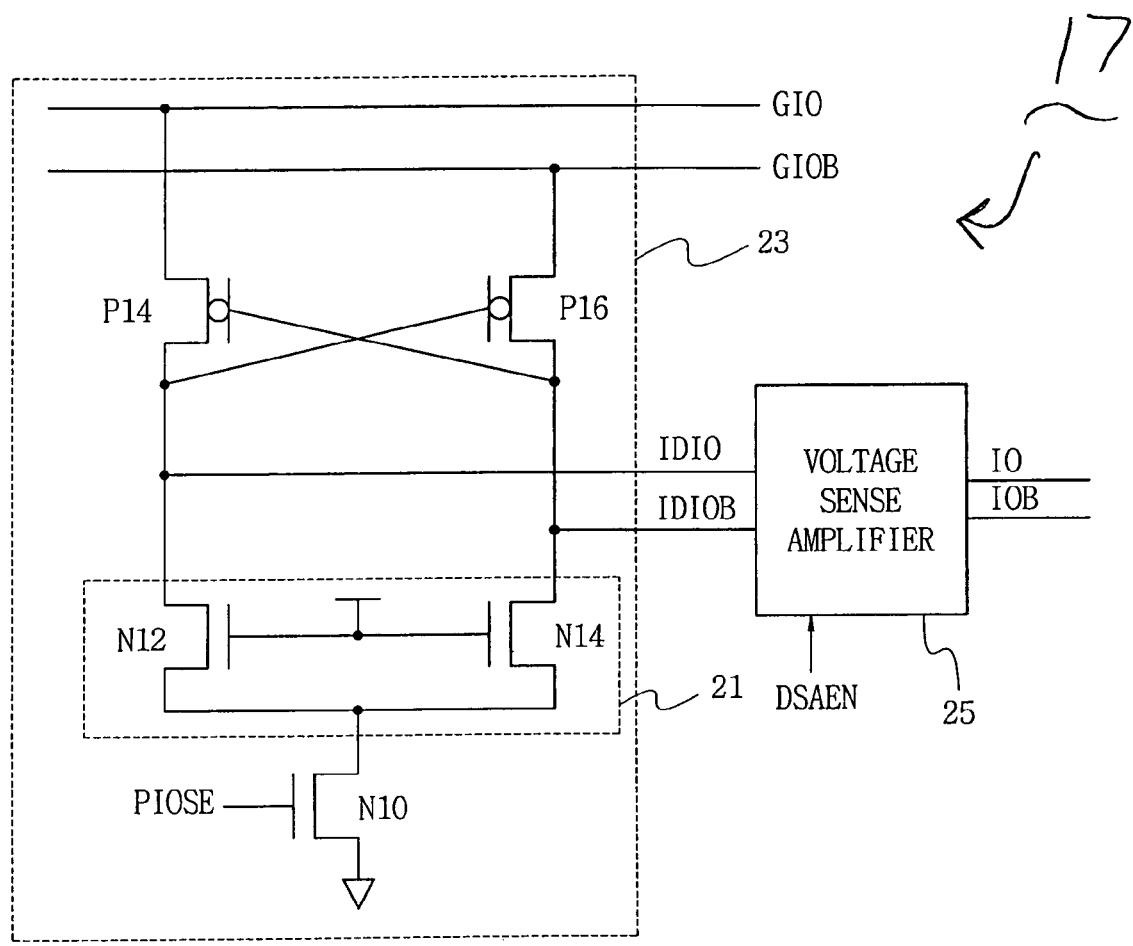
FIG. 3 is a block diagram of a data sense amplifier of the memory system of FIG. 1.
Figure 4:
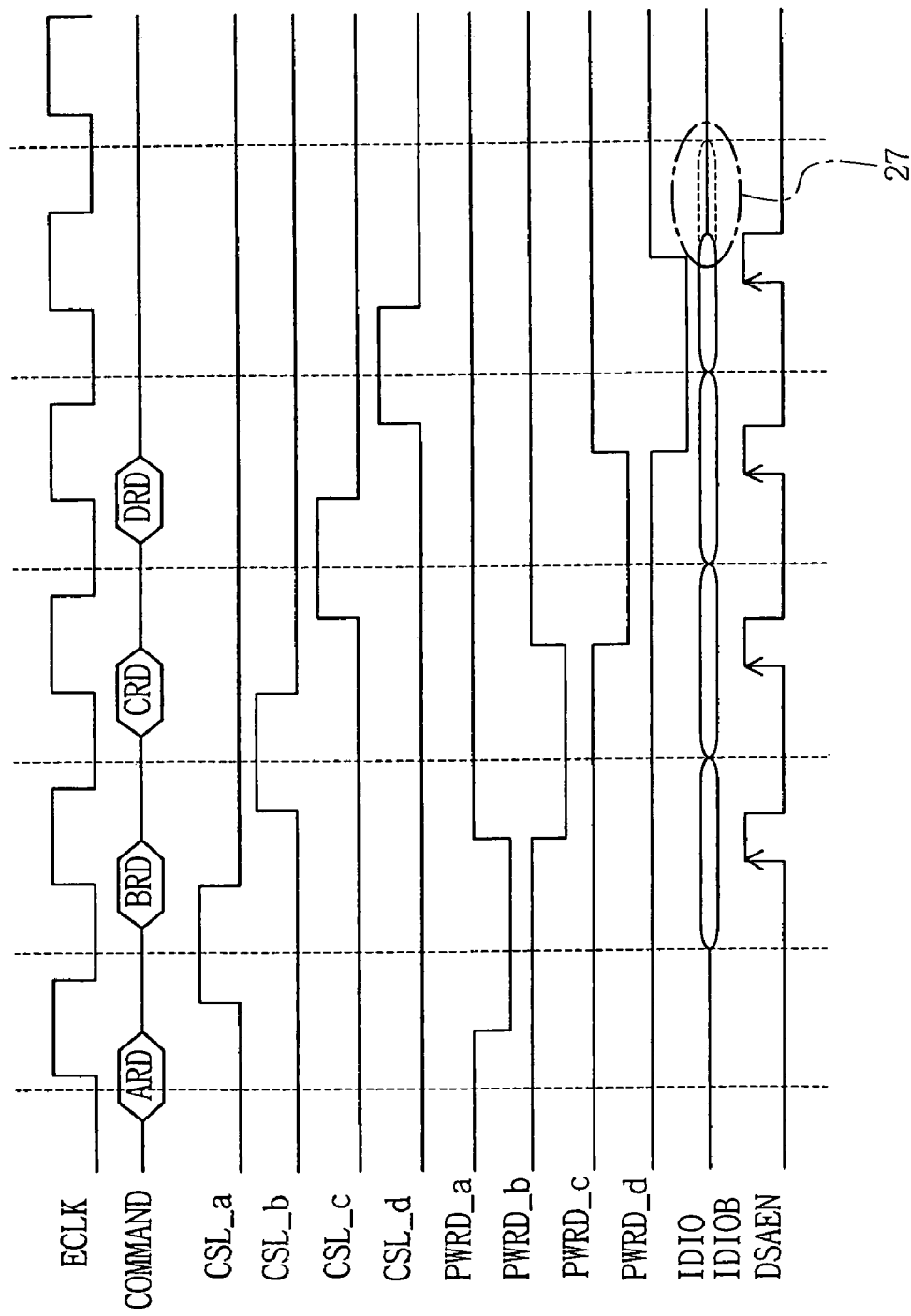
FIG. 4 is a timing diagram illustrating mode of operation of the conventional memory system of FIG. 1.

The exemplary bank switch control unit 116 of FIG. 5 can be implemented in the memory system of FIG. 1 to increase the period of enablement of a given bank selection control signal PWRD_i for the last selected memory bank in an interleave operation to thereby increase the data sensing margin for sensing data that is read from the last selected memory bank. An exemplary mode of operation of the bank switch control unit 116 of FIG. 5 will be described in further detail with reference to the exemplary timing diagram of FIG. 6. In particular, FIG. 6 is a timing diagram illustrating an exemplary mode of operation of the bank switch control unit 116 of FIG. 15 wherein it is assumed that the bank switch control unit 116 is implemented in the memory system of FIG. 1 to perform a bank interleave operation for four memory banks 10A~10D.

Figure 6:
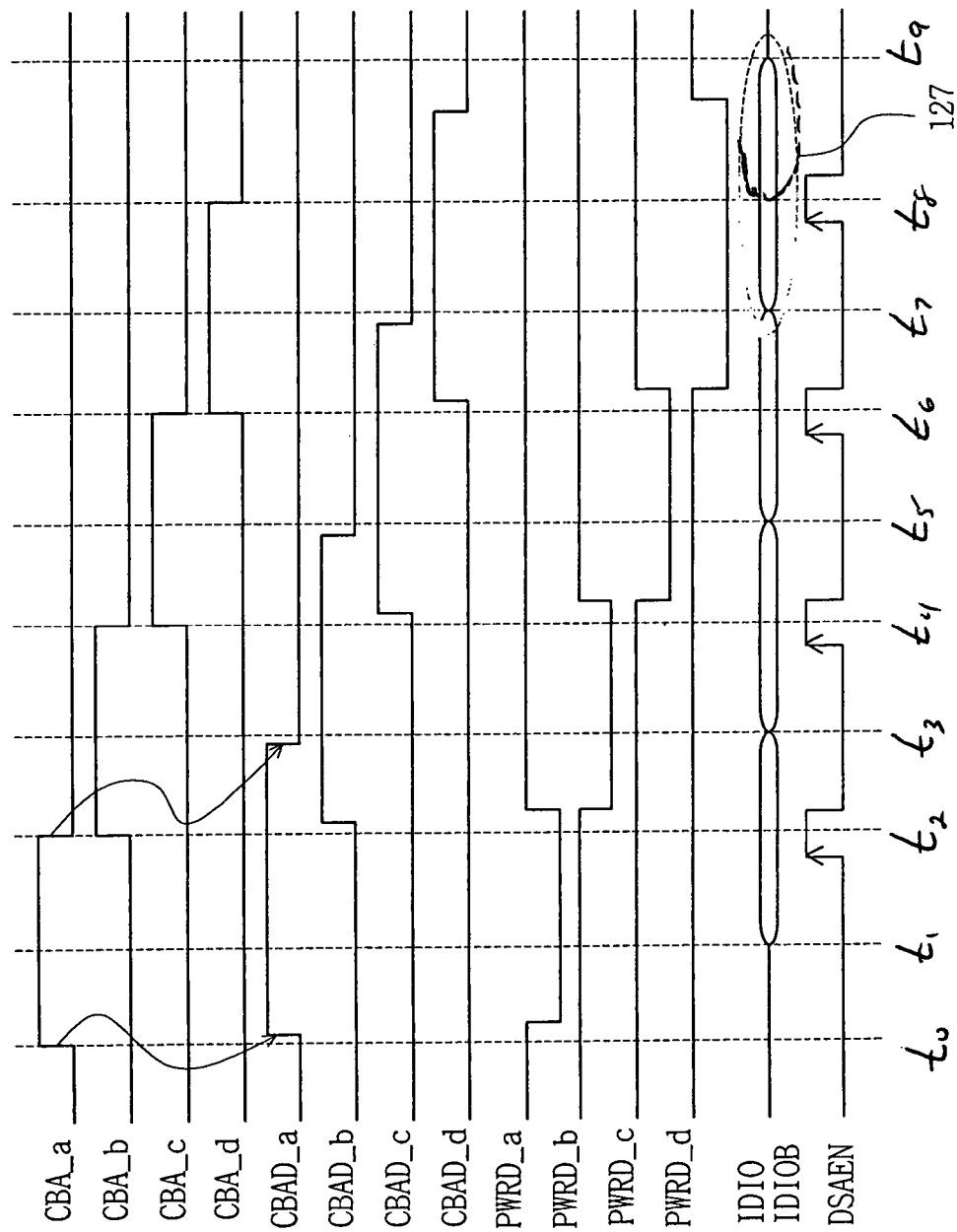
FIG. 6 is a timing diagram illustrating a mode of operation of the circuit of FIG. 5, according to an exemplary embodiment of the invention.

Referring to FIG. 6, it is assumed that the first through fourth memory bank selection signals CBA_a, CBA_b, CBA_c and CBA_d are sequentially enabled. In particular, as depicted in FIG. 6, the first memory bank selection signal CBA_a is enabled at time t0. At time t2, the first memory bank selection signal CBA_a is disabled while the second memory bank selection signal CBA_b is enabled. At time t4, the second memory bank selection signal CBA_b is disabled while the third memory bank selection signal CBA_c is enabled. At time t6, the third memory bank selection signal CBA_c is disabled while the fourth memory bank selection signal CBA_d is enabled. At time t8, the fourth memory bank selection signal CBA_d is disabled, ending the selection sequence.

When the first memory bank selection signal CBA_a is enabled at time t0, the delay circuit 101 of the first unit control block 116a outputs a first delayed memory bank selection signal CBAD_a having a longer enable period than CBA_a by a predetermined time. Similarly, the delay circuits 102, 103, 104 output respective second through fourth delayed memory bank selection signals CBAD_b, CBAD_c, CBAD_d by delaying the respective enabled second through fourth memory bank selection signals CBA_b, CBA_c and CBA_d. The delayed memory bank selection signals CBAD_a, CBAD_b, CBAD_c, CBAD_d are input to the respective NAND gates NA101~NA104 to generate respective bank selection control signals PWRD_a~PWRD_d (enabled logic low). The increased enable periods of the delayed memory bank selection signals CBAD_a, CBAD_b, CBAD_c, CBAD_d provide means for increasing the data sensing margin for a last selected memory bank, regardless of the order of selection of the memory banks.

The delayed memory bank selection signals CBAD_a, CBAD_b, CBAD_c and CBAD_d, have overlapping enabled periods. For instance, an end portion of the enabled period of the first bank selection signal CBAD_a overlaps with the beginning of the enabled period of the second bank selection signal CBAD_b, and so on. Despite the overlapping enabled periods of the delayed memory bank selection signals CBAD_a, CBAD_b, CBAD_c, CBAD_d, the enable periods (logic low) of respective bank selection control signals PWRD_a, PWRD_b, PWRD_c, PWRD_d do not overlap (i.e., no two signals are enabled at the same time). This is because the delayed memory bank selection signals CBAD_a, CBAD_b, CBAD_c, CBAD_d are gated by the output signals of the respective NOR gates NO101~NO104, which receive as input the bank selection signals CBA_a, CBA_b, CBA_c, CBA_d. In particular, in any of the unit control blocks 116a~116d, when an enabled (logic "1") bank selection signal CBA_i is input to a NOR gate, the output of the NOR gate will be logic "0", which causes the control signal PWRD_i to be disabled (logic high), regardless of the logic value of the respective delay signal CBAD_i input to the NAND gate.

For example, in FIG. 6, at time t0, when a first memory bank selection signal CBA_a is input to the delay circuit 101 of the first unit control block 116a, the delayed signal CBAD_a (logic "1") is output from the delay circuit 101. In addition, since the second through fourth memory bank selection signals CBA_b, CBA_c and CBA_d (of logic 0) are inputted to the NOR circuit NO101 of the first unit control block 116a, the output of the NOR gate NO101 is logic "1". Accordingly, the NAND circuit NA101 outputs an enabled control signal PWRD_a (logic low). Thereafter, at time t2, the signal CBA_a is disabled (logic "0"), and CBA_b is enabled (logic "1"). As a result, a delayed signal CBAD_b is output from the delay circuit 102 of unit 116b. Although the first delayed signal CBAD_a is still enabled for some period of time after the second delayed signal CBAD_b is enabled, the control signal PWRD_a is disabled due to an enabled CBA_b being input to the NOR gate NO101 of the unit 116a, which results in a logic "0" being output from the NOR gate NO101. Thus, although CBAD_a is still enabled (logic "1") well after time t2, the signal PWRD_a is disabled to logic "1" due to the logic "0" output of the NOR gate NO101. Similarly, at time t4, the enabling of CBA_c and disabling of CBA_b results in disabling of PWRD_b output from the unit 116b due to the input of enabled CBA_c into the NOR gate NO102.

At time t6, the fourth (and last) memory bank selection signal CBA_d is enabled, while the third memory bank selection signal CBA_c is disabled. The enabled signal CBA_d input to the NOR gate NO103 of the unit 116c results in disabling the signal PWRD_c, while the signal PWRD_d is enabled. At time t8, although all bank selection signals CBA_a~CBA_d are disabled, the delayed control signal CBAD_d remains enabled after time t8, thereby continuing to output an enabled PWRD_d. Indeed, since the inputs CBA_a~CBA_c to the NOR gate NO104 of unit 116d are at logic "0", the control signal PWRD_d remains enabled for an extended time according to the extended enable period of the delayed bank selection signal CBAD_d.

Thus, in the exemplary embodiment described above in FIG. 6, the enable period of the bank selection control signal PWRD_d (for the last selected memory bank) is effectively longer than the enable periods of the previous generated bank selection control signals PWRD_a, PWRD_b and PWRD_c. In other words, a disabling of the bank selection control signal PWRD_d is delayed by a predetermined time more than the bank selection control signals PWRD_a, PWRD_b and PWRD_c. By enabling the bank selection control signal PWRD_d for a longer period of time, the input signal of the internal data input/output line IDIO,IDIOB which is input to the data sense amplifier 17 (FIG. 1) in response to data sense amplifier enable signal DSAEN, can be maintained for a longer period of time. In particular, as depicted in FIG. 6, the increased enable period of PWRD_d increases the valid window 127 for the data sense amplifier to sense the data read from the last selected memory bank, thereby ensuring a sensing margin and solving an operating frequency limit problem. With the exemplary framework discussed above, the memory banks can be selectively connected to the global data lines in any sequence, such that the enablement period of the bank selection control signal PWRD_i for the last selected memory bank will be increased irrespective of the bank sequence.

While the present invention has been particularly shown and described with reference to exemplary embodiments thereof, it will be understood by those skilled in the art that various changes in form and details may be made therein without departing from the spirit and scope of the present invention as defined by the appended claims. For example, internal configuration of the circuit may be varied or internal elements of the circuit may be replaced with other equivalent elements. Accordingly, these and other changes and modifications are considered to be within the true spirit and scope of the invention as defined by the appended claims.

I claim:

1. A bank selection signal control circuit for a semiconductor memory device, the circuit comprising:

a bank switch control unit that receives memory bank selection signals and outputs corresponding memory bank selection control signals to selectively connect memory banks to a global data input/output line according to a predetermined sequence, wherein for each selected memory bank in the predetermined sequence which is selected prior to a last selected memory bank, the bank switch control unit outputs memory bank selection control signals that are enabled for a first time period P1, and wherein for the last selected memory bank in the predetermined sequence, the bank switch control unit outputs a memory bank selection control signal that is enabled for a second time period P2, wherein P2 is greater than P1; and a switching unit for sequentially connecting each selected memory bank to the global data input/output line according to the predetermined sequence, and for a predetermined period P1 or P2, in response to the corresponding bank selection control signals.

2. The circuit of claim 1, wherein the global data input/output line is connected to a data sense amplifier block for sensing and amplifying data transmitted through a local data bus of the selected memory bank.

3. The circuit of claim 2, wherein the data sense amplifier block comprises a current sense amplifier for sensing, amplifying and outputting data transmitted through the global data input/output line; and a voltage sense amplifier for sensing, amplifying and outputting an output of the current sense amplifier.

4. The circuit of claim 3, wherein the switching unit includes transistors that are respectively connected between the memory bank and the global data input/output line.

5. The circuit of claim 3, wherein the bank switch control unit comprises a plurality of unit control blocks, wherein each unit control block generates a memory bank selection control signal for a corresponding memory block, wherein each unit control block comprises:

a delay circuit for receiving the memory bank selection signal for the corresponding memory bank and delaying the bank selection signal for a predetermined period to generate a delayed bank selection signal;

a first logic circuit for receiving and logically combining the memory bank selection signals corresponding to other memory banks not including the memory bank selection signal applied to the delay circuit; and a second logic circuit for receiving and logically combining output signals of the delay circuit and the first logic circuit to generate the bank selection control signal for the corresponding memory bank.

6. The circuit of claim 5, wherein the bank switch control unit comprises first, second, third and fourth unit control blocks which output respective first, second, third and fourth memory bank selection control signals for corresponding first, second, third and fourth memory blocks, in response to respective first, second, third and fourth memory bank selection signals individually input to the delay circuits of respective first, second, third and fourth unit control blocks, and wherein the first logic circuit for each unit control block receives as input the memory bank selection signals corresponding to all other memory banks.

7. The circuit of claim 5, wherein the first logic circuit is a NOR circuit.

8. The circuit of claim 7, wherein the second logic circuit is a NAND circuit.

9. A semiconductor memory device, comprising:
a plurality of memory banks;
a global data input/output line shared by the plurality of memory banks;
a data sense amplifier connected to the global data input/output line;
a multiplexer for selectively connecting the memory banks to the global data input/output line in response to bank selection control signals; and
a bank selection signal control circuit for generating the bank selection control signals to control the multiplexer, wherein at least one bank selection control signal for selectively connecting one of the memory banks with the global data input/output line is enabled for a time period P2 which is greater than a time period P1 for which all other bank selection control signals are enabled.

10. The device of claim 9, wherein the semiconductor memory device performs a bank interleave operation.

11. The device of claim 10, wherein the at least one bank selection control signal enabled for a time period of P2 is generated for a last selected memory bank of a predetermined sequence of selected memory banks in the bank interleave operation.

12. The device of claim 11, wherein the bank selection signal control circuit comprises:
a bank switch control unit that receives memory bank selection signals and outputs corresponding memory bank selection control signals to selectively connect the memory banks to the global data input/output line according to the predetermined sequence; and
a multiplexer for sequentially connecting each selected memory bank to the global data input/output line according to the predetermined sequence, and for a predetermined period P1 or P2, in response to the corresponding bank selection control signals.

13. The device of claim 12, wherein the multiplexer includes transistors that are respectively connected between the memory bank and the global data input/output line.

14. The device of claim 12, wherein the bank switch control unit comprises a plurality of unit control blocks, wherein each unit control block generates a memory bank selection control signal for a corresponding memory block, wherein each unit control block comprises:
a delay circuit for receiving the memory bank selection signal for the corresponding memory bank and delaying the bank selection signal for a predetermined period to generate a delayed bank selection signal;
a first logic circuit for receiving and logically combining the memory bank selection signals corresponding to other memory banks not including the memory bank selection signal applied to the delay circuit; and
a second logic circuit for receiving and logically combining output signals of the delay circuit and the first logic circuit to generate the bank selection control signal for the corresponding memory bank.

15. The device of claim 14, wherein the bank switch control unit comprises first, second, third and fourth unit control blocks which output respective first, second, third and fourth memory bank selection control signals for corresponding first, second, third and fourth memory blocks, in response to respective first, second, third and fourth memory bank selection signals individually input to the delay circuits of respective first, second, third and fourth unit control blocks, and wherein the first logic circuit for each unit control block receives as input the memory bank selection signals corresponding to all other memory banks.

16. The device of claim 15, wherein the first logic circuit is a NOR circuit and the second logic circuit is a NAND circuit.

17. A method for performing a bank interleaving operation in a semiconductor memory device having a plurality of memory banks, the method comprising:
receiving a sequence of bank selection signals for selecting a plurality of memory banks;
outputting a sequence of bank selection control signals in response to the sequence of bank selection signals to selectively connect the memory banks to a global data input/output line according to a predetermined sequence, wherein at least one of the bank selection control signals is enabled for a time period P2 which is greater than a time period P1 for which all other bank selection control signals are enabled.

18. The method of claim 17, wherein the at least one bank selection control signal enabled for the time period of P2 is output in response to the bank selection signal for a last selected memory bank in the predetermined sequence for the bank interleave operation.

19. The method of claim 18, wherein outputting the sequence of bank selection control signals in response to the sequence of bank selection signals, comprises:
delaying a selected one of the bank selection signals among the plurality of bank selection signals to generate a delayed bank selection signal;
logically combining one or more non-selected bank selection signals through a first logic circuit; and
logically combining the delayed bank selection signal and an output signal of the first logic circuit through a second logic circuit, to generate a bank selection control signal corresponding to the selected bank selection signal.

20. The method of claim 19, wherein the first logic circuit is a NOR circuit and the second logic circuit is a NAND circuit.

* * * * *